(12) United States Patent
Ducreux

(10) Patent No.: US 7,282,750 B2
(45) Date of Patent: Oct. 16, 2007

(54) SEMICONDUCTOR COMPONENT COMPRISING AREAS WITH A HIGH PLATINUM CONCENTRATION

(75) Inventor: Gérard Ducreux, Luynes (FR)

(73) Assignee: STMicroelectronics S.A., Montrouge (FR)

( * ) Notice: Subject to any disclaimer, the term of this patent is extended or adjusted under 35 U.S.C. 154(b) by 320 days.

(21) Appl. No.: 11/014,614

(22) Filed: Dec. 16, 2004

(65) Prior Publication Data

US 2005/0133887 A1 Jun. 23, 2005

(30) Foreign Application Priority Data

Dec. 18, 2003 (FR) .................................. 03 51111

(51) Int. Cl.
*H01L 29/68* (2006.01)
*H01L 21/32* (2006.01)

(52) U.S. Cl. ...................... 257/170; 438/140

(58) Field of Classification Search ............... 257/170, 257/608, 610; 438/140, 543
See application file for complete search history.

(56) References Cited

U.S. PATENT DOCUMENTS

| 3,947,864 A | 3/1976 | Yatsuo et al. |
| 4,792,833 A | 12/1988 | Fukushima |
| 4,855,799 A | 8/1989 | Tanabe et al. |
| 2002/0179925 A1 | 12/2002 | Tihanyi |

FOREIGN PATENT DOCUMENTS

DE 100 01 871 A1 8/2001

OTHER PUBLICATIONS

French Search Report from French Patent Application 03/51111, filed Dec. 18, 2003.
Patent Abstracts of Japan, vol. 0144, No. 37 (E-0980), Sep. 19, 1990 & JP 2 170471 A (Fuji Electric Co. Ltd.).

*Primary Examiner*—Lex Malsawma
(74) *Attorney, Agent, or Firm*—Lisa K. Jorgenson; James H. Morris; Wolf, Greenfield & Sacks, P.C.

(57) ABSTRACT

A structure formed in a semiconductor substrate having at least one area having a high concentration of atoms of a metal such as platinum or gold, in which the area is surrounded with at least one first trench penetrating into the substrate.

12 Claims, 2 Drawing Sheets

SEMICONDUCTOR COMPONENT COMPRISING AREAS WITH A HIGH PLATINUM CONCENTRATION

BACKGROUND OF THE INVENTION

1. Field of the Invention

The present invention relates to monolithic structures comprising one or several power or high-voltage switching or protection component(s), formed in a semiconductor substrate and methods for forming such structures. The present invention more specifically relates to such components comprising areas with a low concentration and areas with a high concentration of a metal such as gold or platinum.

2. Discussion of the Related Art

In such structures, it is sometimes desired to reduce the minority carrier lifetime in a component, for example, to obtain a fast diode. For this purpose, diffusions of metal atoms such as gold or platinum are currently used. Such diffusions result, for example from the deposition of a platinum layer on a semiconductor substrate and from an anneal to diffuse the platinum into the substrate.

A disadvantage of this method is that the platinum very rapidly diffuses into the substrate and that the process is difficult to control. In particular, it appears to be difficult to perform a platinum diffusion at selected locations only of a silicon substrate.

SUMMARY OF THE INVENTION

An object of the present invention is to provide a semiconductor component manufacturing method which enables introducing platinum into determined areas of a semiconductor substrate.

Another object of the present invention is to provide a semiconductor component structure in which only certain components or component portions comprise platinum.

To achieve these and other objects, the present invention provides a structure formed in a semiconductor substrate comprising at least one area having a high concentration of atoms of a metal such as platinum or gold, in which said area is surrounded with at least one first trench penetrating into the substrate.

According to an embodiment of the present invention, said at least one first trench is filled with an insulator such as silicon oxide.

According to an embodiment of the present invention, said at least one first trench has a depth ranging between 5 and 50 µm.

According to an embodiment of the present invention, the structure further comprises at least one second trench in the substrate surface opposite to that comprising said at least one first trench, and substantially opposite thereto.

According to an embodiment of the present invention, said area corresponds to all or part of the semiconductor areas constitutive of a diode.

According to an embodiment of the present invention, said at least one first trench is formed in an insulating wall insulating a component comprising said area from other components.

According to an embodiment of the present invention, the structure forms the association of a fast diode and of a slow diode formed of a semiconductor region of a first type formed in a layer of a second type, said at least one trench being formed short of the periphery of said region.

The present invention also provides a method for forming, in a semiconductor substrate, an area having a high concentration of atoms of a metal such as platinum, comprising forming at least one first trench penetrating into the substrate around said area; depositing said metal substantially above the central portion of said area; and diffusing the metal into all of said area, the number n, the depth p, the spacing e, and the width t of trenches being a function of the depth 1' of the area and the ratio k between the surface diffusion speed and the volume diffusion speed of the said metal according to the following relation: $(2p+e+t)*n>k*1'$.

The foregoing objects, features, and advantages of the present invention will be discussed in detail in the following non-limiting description of specific embodiments in connection with the accompanying drawings.

DETAILED DESCRIPTION

FIGS. 1 to 5 are partial simplified views and are only intended to simplify the understanding of the following description. It will be within the abilities of those skilled in the art to form practical devices by using known techniques. Further, as usual in the field of the representation of semiconductor components, the dimensions of the various layers and regions are not drawn to scale.

The present invention is based on an analysis of the diffusion process of a metal such as platinum in a semiconductor substrate, for example, silicon.

Figure 1:
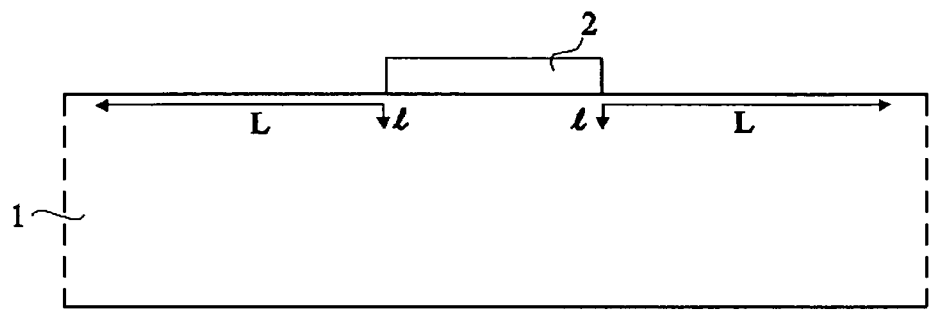
FIG. 1 is a cross-section view of a portion of a semiconductor substrate in which platinum is desired to be introduced.

FIG. 1 is a cross-section view of a semiconductor substrate 1 on which a metal portion 2, which is desired to be diffused into the substrate, has been deposited.

For a given diffusion time, a volume diffusion of depth 1 is observed in the substrate and a lateral diffusion of length L is observed at the substrate surface. In the case of platinum, length L is approximately 16 times as large as depth 1, the volume diffusion of the metal being much slower than its surface diffusion. In the case of gold, this ratio is of approximately 7 to 1.

The following examples will be given in the case of platinum, noting that the present invention also applies to other metals, for example, gold. If platinum is desired to be diffused down to a depth 1 of a few tens of µm, for example, 30 µm, surface diffusion length L is approximately 500 µm on either side of metal portion 2. For 30 µm of in-depth diffusion, a surface diffusion of the substrate over approximately 1 mm² is observed.

It thus appears to be impossible in practice to form on the same semiconductor substrate areas having undergone a platinum diffusion and platinum-free areas, unless very large distances are provided between these areas.

Figure 2A:
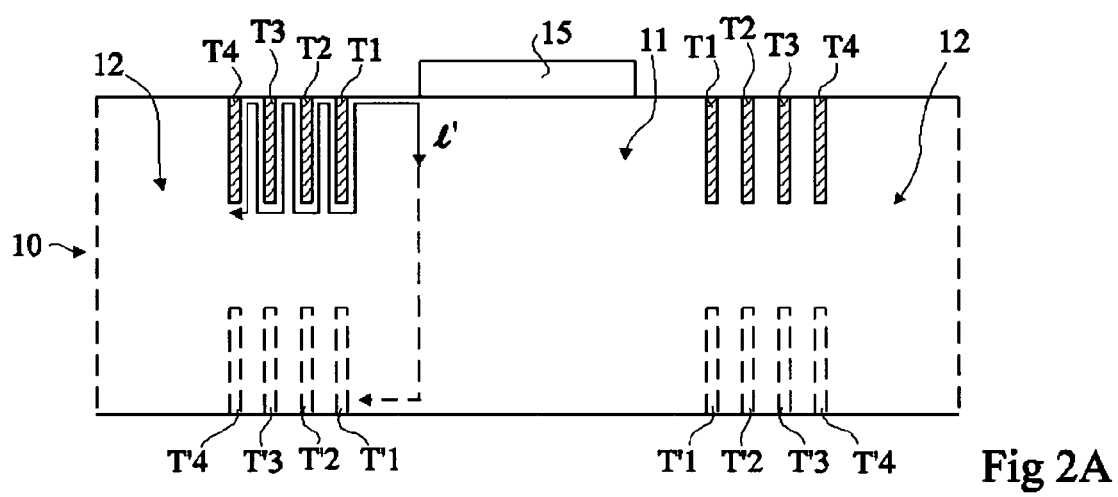
FIGS. 2A and 2B respectively are a cross-section view and a top view of a semiconductor substrate according to the present invention in which platinum is desired to be introduced into a predetermined area.
Figure 2B:
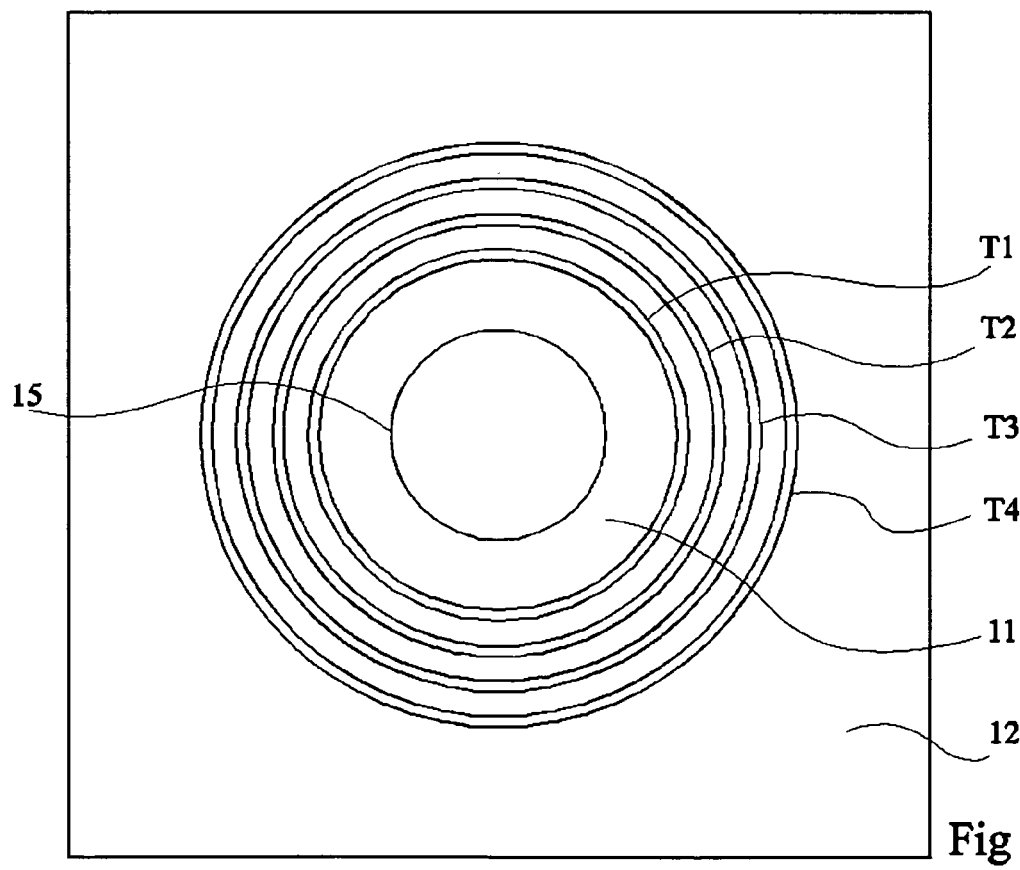

FIGS. 2A and 2B respectively are a cross-section view and a top view of a structure according to the present invention formed in a semiconductor substrate 10. In this example, platinum is desired to be introduced into central portion 11 of substrate 10 without introducing platinum into peripheral portion 12 of substrate 10. Before diffusing platinum into substrate 10, a succession of trenches T1, T2, T3, and T4 are formed at the front surface of the substrate around central portion 11 of substrate 10. The trenches are in this example ring-shaped in top view. The trench depth typically is of a few tens of μm. The width and the spacing of the trenches are provided to be as thin as possible, typically of a few μm, to form a large number of trenches on a small substrate surface.

Number n, depth p, spacing e, and width t of the trenches are determined according to the depth of diffusion 1' which is desired in central portion 11. The relation between these data is substantially the following: $(2p+e+t)*n=1'*16$, where 16 corresponds to the ratio between the surface diffusion speed and the volume diffusion speed in the case of platinum. If a diffusion depth 1' of approximately 20 μm is desired to be obtained, approximately 10 trenches of a 15 μm depth, of a 2-μm width, and spaced apart by 3 μm, could be provided.

Once the trenches have been formed in substrate 10, a portion of platinum layer 15 is placed above central portion 11 of substrate 10. The structure is then placed in an enclosure heated at a temperature of approximately 900° C. for a time corresponding to the time necessary to diffuse platinum substantially down to the selected depth 1'.

If platinum is desired to be diffused across the entire thickness of the substrate, by depositing, as previously, platinum at the front surface of the substrate above central portion 11, it may be necessary to provide trenches T'1, T'2, T'3, and T'4 at the rear surface of the substrate, as shown in dotted lines in FIG. 2A. Trenches T'1 to T'4 are then used to limit the lateral diffusion of platinum along the rear surface when platinum arrives at the level of the rear surface after having diffused through then entire substrate thickness.

Figure 3:
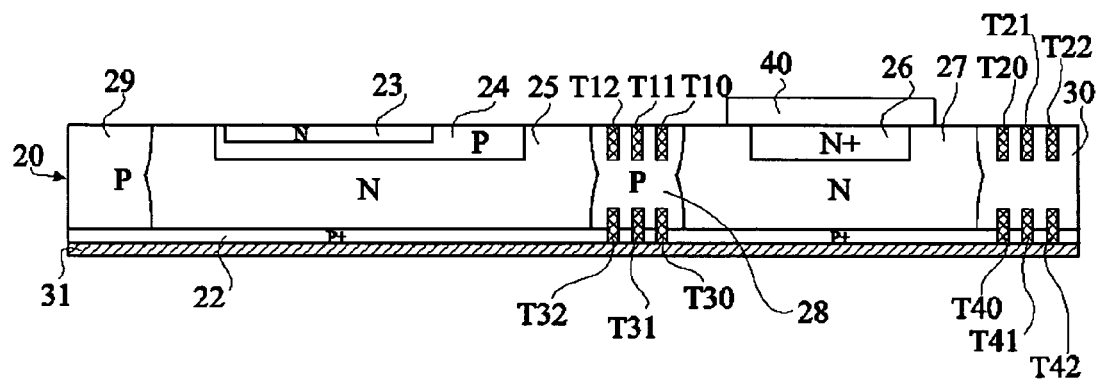
FIG. 3 is a cross-section view of a portion of a circuit according to the present invention.

FIG. 3 is a cross-section view of a portion of a monolithic structure comprising a thyristor and a diode. The monolithic structure is formed in a semiconductor substrate 20. A heavily-doped P-type anode region 22, common to the thyristor and to the diode, is formed on the rear surface side of substrate 20. The thyristor further comprises an N-type cathode region 23, formed on the front surface side of substrate 20 in a P-type well 24, itself formed in a portion 25 of substrate 20. The diode further comprises a heavily-doped N-type cathode contact region 26, formed on the front surface side in a portion 27 of substrate 20. Portions 25 and 27 of substrate 20 are separated by a P-type doped insulating wall 28. An insulating wall 29 is placed between portion 25 of substrate 20 and the circuit edge. An insulating wall 30 insulates the diode from a possible other component of the monolithic structure, not shown. A conductive layer 31 covers the rear surface of substrate 20.

In the example of a structure shown in FIG. 3, platinum is desired to be introduced into all the semiconductor areas of the diode to create a fast diode, without introducing any platinum into the thyristor, nor into any other component placed next to the diode. For this purpose, trenches are formed in insulating walls 28 and 30 at the front and rear surfaces of the substrate. At the front surface of the substrate, trenches T10, T11, and T12 are formed at the surface of insulating wall 28 and trenches T20, T21, and T22 are formed at the surface of insulating wall 30. At the rear surface of the substrate, trenches T30, T31, and T32 are formed at the surface of insulating wall 28 and trenches T40, T41, and T42 are formed at the surface of insulating wall 30.

Although, in the cross-section view, different reference numerals have been assigned to the trenches located to the right and to the left of the diode, it should be noted that, as illustrated in FIG. 2B, these may be ring-shaped trenches.

A method of platinum diffusion into the diode then comprises placing a platinum layer portion 40 substantially above cathode region 26, then placing the structure in a heated enclosure for a duration corresponding to the time required to diffuse a sufficient amount of platinum to the rear surface of substrate 20 (at least to the interface between substrate portion 27 and P layer 22). Grooves T then limit the lateral diffusion of platinum.

Figure 4:
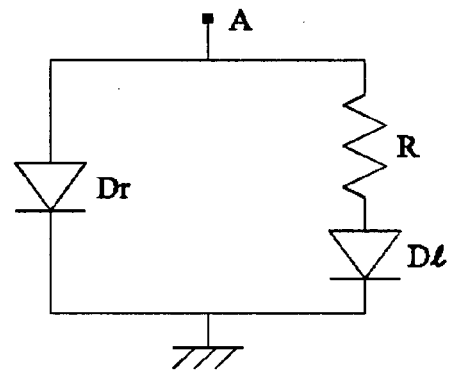
FIG. 4 is an electric diagram of a power circuit.

FIG. 4 is an electric diagram of a circuit frequently used in power electronics and comprising a fast diode Dr generally obtained by introducing platinum in all or part of the semiconductor areas constitutive of the diode and a slow diode D1 which does not contain platinum. Diodes D1 and Dr are placed in parallel between an anode region A and the ground, their cathodes being grounded. A resistor R may be placed between anode terminal A and the anode of diode D1. The value of resistance R is set according to the switching characteristics desired for the circuit.

Figure 5:
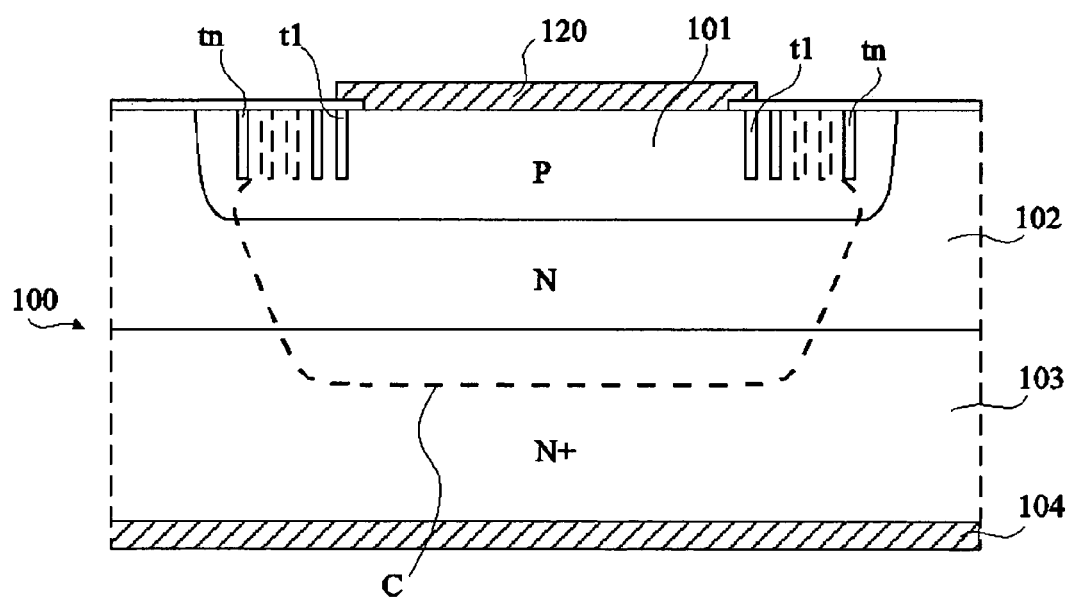
FIG. 5 is a cross-section view of the circuit schematized in FIG. 4.

FIG. 5 is a cross-section view of an embodiment in the form of a monolithic structure according to the present invention of the two diodes of FIG. 4. The structure is formed in a semiconductor substrate 100. A heavily-doped P-type region 101 is formed on the front surface side of substrate 100 in an N-type thick layer 102. A heavily-doped N-type cathode region 103 is placed under thick layer 102 on the rear surface side of substrate 100. A conductive layer 104 covers the rear surface of substrate 100.

According to the present invention, trenches t1 to tn are formed beyond the periphery of anode region 101. In the case where anode region 101 is square-shaped in top view, trenches t1 to tn form a set of squares placed one inside of the other. The trenches are, as previously, narrow and close to one another and are preferably filled with an insulating material.

An insulating layer covers the front surface of substrate 100 except above a central portion of anode region 101 located inside of trenches t1 to tn. A platinum pad 120 is in contact with the central portion of anode region 101. Then, after a thermal processing, platinum diffuses into the central portion of P anode region 101, as well as into a portion of thick layer 102 and possibly into a portion of cathode region 103 placed substantially above this central portion. The limit of the area in which the platinum concentration is sufficient to modify the minority carrier lifetime has been illustrated by a curve C.

Fast diode Dr then corresponds to the "central" diode formed of the portion delimited by curve C. Slow diode D1 corresponds to the "peripheral" diode formed of the peripheral portion of the junction between anode region 101 and layer 102 external to the portion defined by curve C. Resistor R corresponds to the resistance of the portion of anode region 101 located between metal pad 120 and the junction between anode region 101 and layer 102.

As an example, the thickness of anode region 101 is 20 μm, and the thickness of layer 102 is 40 μm. Curve C starts for example from the limit of the n-th layer and goes down to a depth of approximately 50 μm with respect to the front surface of the substrate. In the case where the trenches have a 15-μm depth, a 5-μm depth, and a 5-μm interval, the number of necessary trenches to obtain curve C is on the order of 20.

Of course, the present invention is likely to have various alterations, modifications, and improvements which will readily occur to those skilled in the art. In particular, it will be within the abilities of those skilled in the art to implement the present invention to introduce platinum into all or part of the semiconductor areas of various components. Various trench depths may be chosen according to the used technologies and to the implied semiconductor structures. Values comprised between 5 and 50 μm may for example be chosen.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A structure formed in a semiconductor substrate comprising at least one area having a high concentration of atoms of a metal, wherein said area is surrounded with at least one first trench penetrating into the substrate, the number n, the depth p, the spacing e, and the width t of trenches being a function of the depth $1'$ of the area and the ratio k between the surface diffusion speed and the volume diffusion speed of the said metal according to the following relation: $(2p+e+t)*n>k*1'$.

2. The structure of claim 1, wherein said at least one first trench is filled with an insulator.

3. The structure of claim 2, wherein said insulator comprises silicon oxide.

4. The structure of claim 1, wherein said at least one first trench has a depth ranging between 5 and 50 μm.

5. The structure of claim 1, further comprising at least one second trench in the substrate surface opposite to that comprising said at least one first trench, and substantially opposite thereto.

6. The structure of claim 1, wherein said area corresponds to all or part of the semiconductor areas constitutive of a diode.

7. The structure of claim 1, wherein said at least one first trench is formed in an insulating wall insulating a component comprising said area from other components.

8. The structure of claim 1, comprising a fast diode and of a slow diode formed of a semiconductor region of a first type formed in a layer of a second type, said at least one trench being formed inside the periphery of said region.

9. The A method for forming, in a semiconductor substrate, an area having a high concentration of atoms of a metal, comprising:

forming at least one first trench penetrating into the substrate around said area, the number n, the depth p, the spacing e, and the width t of trenches being a function of the depth $1'$ of the area and the ratio k between the surface diffusion speed and the volume diffusion speed of the said metal according to the following relation: $(2p+e+t)*n>k*1'$;

depositing said metal substantially above the central portion of said area; and diffusing the metal into all of said area.

10. The structure of claim 1, wherein said metal comprises one of platinum and gold.

11. The structure of claim 1, wherein the at least one first trench comprises multiple trenches.

12. The structure of claim 9, wherein said metal comprises platinum.

* * * * *